United States Patent [15] 3,694,081

Keller [45] Sept. 26, 1972

[54] METHOD AND APPARATUS FOR CONTACT PRINTING

[72] Inventor: Charles H. Keller, Sunnyvale, Calif.

[73] Assignee: Pek, Inc., Sunnyvale, Calif.

[22] Filed: Feb. 11, 1970

[21] Appl. No.: 10,348

[52] U.S. Cl. .....................................355/91, 355/132
[51] Int. Cl. ..........................G03b 27/20, G03b 27/2
[58] Field of Search..........355/73, 76, 91, 92, 93, 94, 355/95, 132

[56] References Cited

UNITED STATES PATENTS

| | | | |
|---|---|---|---|
| 1,166,945 | 1/1916 | Sweigard | 355/93 |
| 2,652,757 | 9/1953 | Robbins | 355/92 |
| 2,100,920 | 11/1937 | Rogers | 355/93 X |
| 1,688,059 | 10/1928 | Sack | 355/93 |
| 2,025,755 | 12/1935 | Lyle | 355/91 X |
| 3,463,587 | 8/1969 | Oltra et al | 355/93 |
| 3,106,145 | 10/1963 | Hutchins | 355/93 |

*Primary Examiner*—Samuel S. Matthews
*Assistant Examiner*—Fred L. Braun
*Attorney*—Limbach, Limbach & Sutton

[57] ABSTRACT

A contact printing system and a process for contact printing using independent transportable, vacuum-frame, workpiece-holding assemblies. The workpiece to be exposed is inserted within a transportable vacuum frame which is then evacuated of substantially all of the air therein. The transportable frame, which automatically maintains itself in the evacuated state is then manually and/or automatically transported to a radiation station where the workpiece is exposed to radiation such as light or ultraviolet radiation. After being exposed the vacuum frame may be manually or automatically removed from the exposure station for further processing. Desirably each vacuum frame includes two transparent plates one for each side of the vacuum frame so that both sides of the vacuum frame can be exposed simultaneously to the radiation.

35 Claims, 6 Drawing Figures

FIG. 1
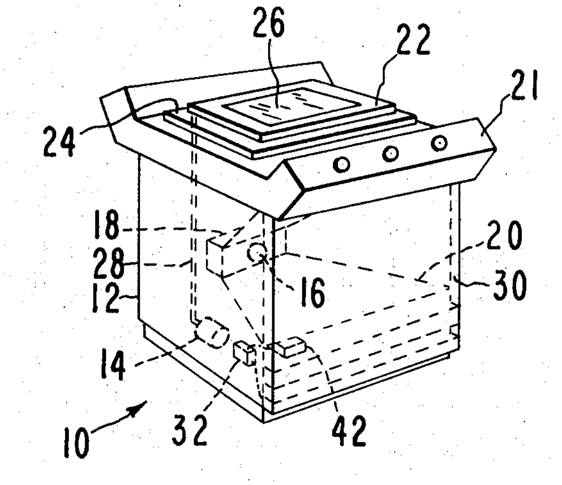
FIG. 2
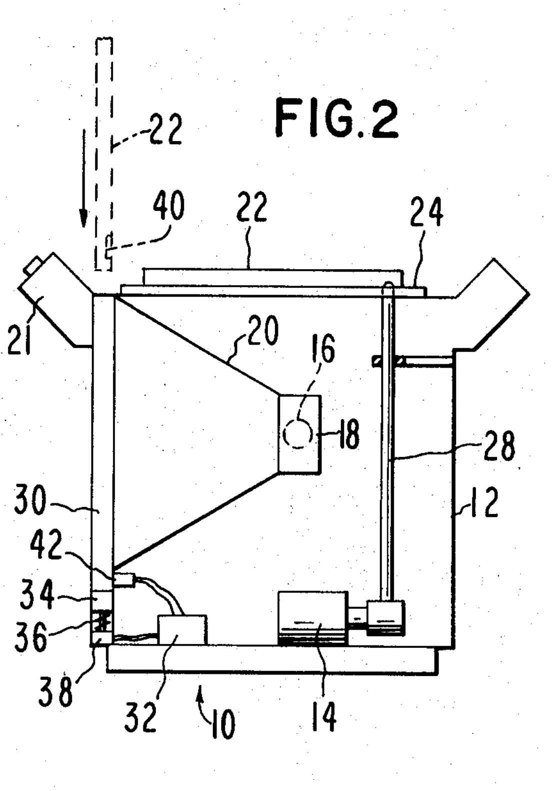
FIG. 4
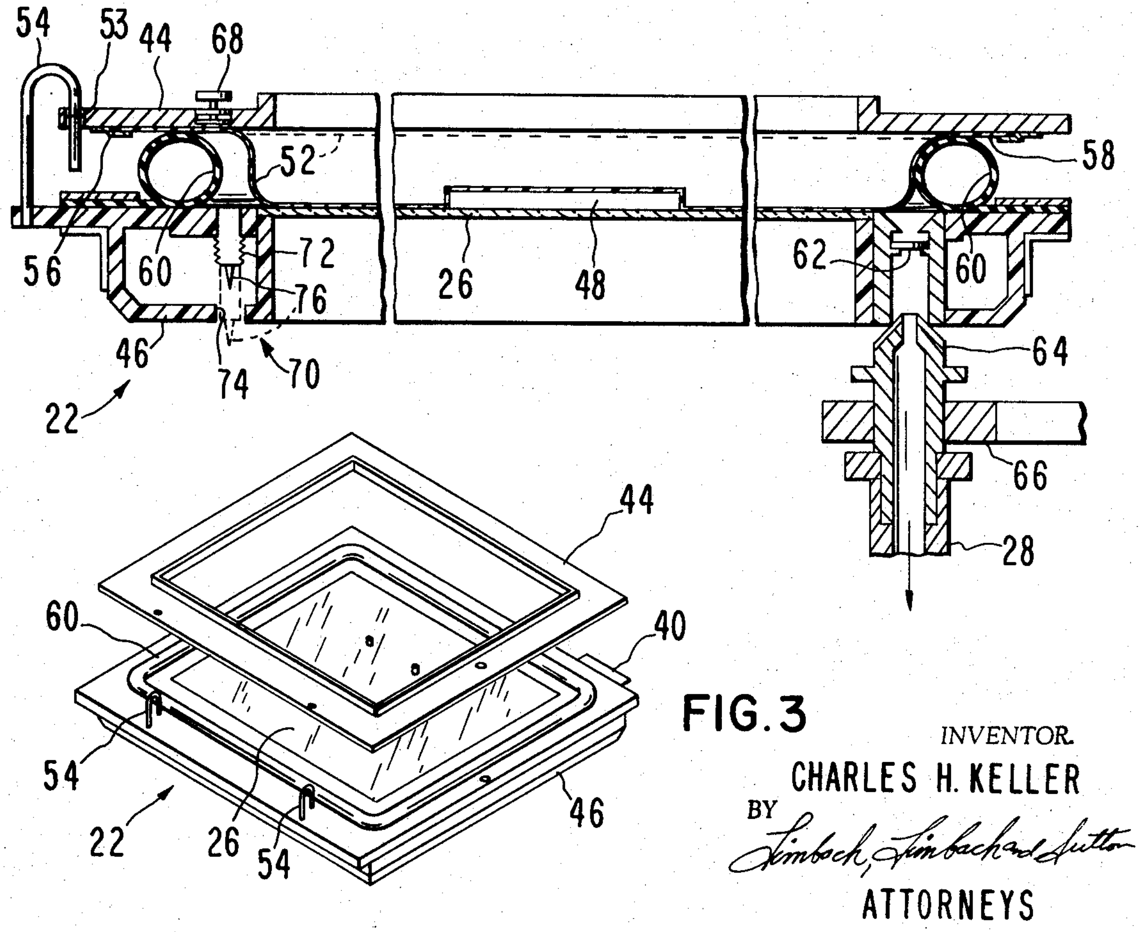
FIG. 3
INVENTOR.
CHARLES H. KELLER
BY Limbach, Limbach and Sutton
ATTORNEYS INVENTOR.
CHARLES H. KELLER
BY
Limbach, Limbach and Sutton
ATTORNEYS

METHOD AND APPARATUS FOR CONTACT PRINTING

BACKGROUND OF THE INVENTION

The present invention relates to a contact printing system and more particularly to an improved contact printing system which has useful applications in the field of printed circuit board manufacturing, chemical milling, integrated circuit manufacturing, lithography, or any other photoprinting application that requires intimate contact within a vacuum frame and subsequent exposure to radiation such as light to form an image within a photosensitive emulsion.

Typically, for present contact printing a vacuum frame is provided in which the workpiece to be exposed to the radiation is placed. The frame is then manually inserted in a housing of which typically, the frame is an integral part. The housing includes air-evacuating equipment for evacuating the air within the frame. While the frame is maintained in this evacuated condition one or both sides of the frame are exposed to radiation such as light or ultraviolet radiation. After the exposure the vacuum is released and the frame and workpiece may be withdrawn from the equipment. It is important to note that the frame when evacuated is integrally maintained as a part of the entire housing. That is, the evacuation and the exposure steps are carried on together within a single housing. The vacuum at which the frame is maintained is about 25 inches of mercury.

Contact printing equipment and particularly at using vacuum techniques has had increasing applications in new fields of technology, as, for example, in those industries utilizing photo-chemical techniques.

For example, in lead frame manufacturing for integrated circuit chips, the use of mechanical dies, which have been prevelant in the past are no longer as attractive as the photo-techniques now available. Similarly, in the integrated circuit manufacturing area, silk screen processes which now accounts for a substantial portion of the manufacturing thereof, will probably become less important as photo processes become less expensive, more reliable and faster.

There are four basic steps in most contact photoprinting processes:

1. First, one applies a photosensitive emulsion often called a "photoresist" material, to the surface of the entire workpiece;

2. Then a mask or pattern positive or negative is placed over the coated workpiece once the coat is dry;

3. Next, the workpiece is exposed to light ot other form of radiation; and finally, 4. The unexposed portion is etched away by chemicals which are ineffective to etch the exposed portions, thereby leaving a relief identical with the pattern of the mask.

The workpiece, of course, depends upon the particular application involved. In the case of lead frame construction, for example, the material upon which the resist is placed is often Kovar. Other workpiece materials might include metals or plastics.

Several varieties of photoresist materials are presently available. For example, Kodak Metal Etch Resist (KMER) and Kodak Ortho-Resist (KOR) are well known photoresists which are applied as a liquid on the workpiece and then allowed to dry.

A new type of photoresist material is now available which, although more expensive than the above described types, is capable of improved dependability, greater speed, and improved resolution. This is referred to as "laminated dry film resist." This type of resist comes in continuous sheets or strips having three layers. The base layer is typically of Mylar of a thickness of about 1 mil; the second is of a photosensitive material having a thickness of from 0.5 to 2.5 mils; and a third is an overlayer for protecting the other two layers.

When used, the overlayer is first stripped from the other two layers which are then placed on the workpiece with the resist layer in contact with the workpiece. After the mask is placed over the resist and the workpiece is exposed to radiation, the Mylar film is removed leaving the exposed resist on the workpiece. The workpiece is then ready for developing.

The advantage of the laminated dry film resist over conventional resists is that the coating of the laminated dry film layer is much more uniform. Furthermore, pinholes, can be preinspected out of the resist of the dry film type.

As a consequence of having a variety of photoresist materials available each having different requirements in terms of radiation exposure times, a desirable feature of contact printing systems would be that they be able to automatically adjust the exposure time depending upon the material being exposed.

Present equipment is often unable to take advantage of the aforementioned improved photoresist materials. Consequently, one of the biggest problems with vacuum printing equipment presently on the market is that most equipment is far too slow for thei high speed requirements of sophisticated technologies now being used.

SUMMARY OF THE INVENTION

It is therefore an object of the present invention to provide improved vacuum contact printing apparatus;

Another object of the present invention is to provide contact printing apparatus having improved resolution capabilities;

Another object of the present invention is to provide contact printing apparatus which is more reliable and yet less bulky and less expensive than prior contact printing apparatus;

Another object of the present invention is to provide a vacuum frame for use in contact printing which is transportable in an evacuated condition;

Another object of the present invention is to provide a vacuum frame which is constructed of ultraviolet transmitting plastic and which may be exposed to light from either side;

Another object of the present invention is to provide a contact printing system which has greater thruput capabilities than prior art equipment and which is better suited than prior art equipment to be adapted with other processing centers;

Another object of the present invention is to provide an improved method and process for contact printing.

In accordance with the present invention contact printing apparatus is provided which includes the use of totally independent, transportable vacuum frames for holding workpieces. The frame may be evacuated and transported to an exposure station located at substantial distances from the evacuation center.

In the preferred embodiment of the present invention the frame includes a transparent sheet or plate made of an ultraviolet transmitting plastic. Such plastic material is more suitable than the presently used glass plates since it is optically more stable, i.e., is less subject to discoloration and to ultraviolet radiation, and is lighter in weight. Additionally, the frame may be constructed so as to be capable of being exposed upon oppositely disposed surfaces. For example, this may be accomplished by using a Mylar sheet or a similar transmitting material in addition to the plastic plate. Mylar is pliable and is able to conform to the workpiece(s) within the frame when the frame is evacuated.

In accordance with another aspect of the present invention the frame includes an indicator for allowing observation of the state of evacuation of the frame. Additionally, means may be provided on the frame which, when utilized with a suitably adopted exposure station, will automatically set the length of exposure depending upon the characteristics of the photosensitive material disposed on the workpiece.

To facilitate more accurate exposures alignment pins may be molded or otherwise formed on the transparent plastic plate for mating with similarly disposed female receiving portions on each of the workpieces.

In another aspect of the present invention, the radiation means includes one, two or more light sources and reflectors oppositely disposed to one another. A vacuum frame, of the type capable of being exposed from either side, is then loaded with the workpieces for exposure. The frame is evacuated and then manually and/or automatically transported to the radiation station for simultaneous exposure on one or both sides of the vacuum frame by the oppositely disposed light sources.

Since the vacuum frames are easily transportable, great flexibility is achieved as compared with prior art systems wherein it was impossible to segregate the evacuated frame from the evacuating source and the ultraviolet radiation equipment. Thus it is possible, for example, to evacuate one or more frames while other double-sided frames are simultaneously being exposed on both sides.

The flexibility thus achieved may be utilized in many ways. For example, in one embodiment of the present invention, a magazine loader may be used into which evacuated frames may be stacked. The frames are dispensed from the magazine to the radiation area as fast as the exposure time permits. Further, a similar type magazine stacker may be used to receive exposed vacuum frames from the radiation area.

It should also be understood that because of the inherent flexibility of transportable vacuum frames the present invention may be utilized with other processing centers in an assembly line fashion for high speed, automated production, a capability not possible with present equipment which is basically manually oriented, on a piece-by-piece basis.

BRIEF DESCRIPTION OF THE DRAWINGS

FIG. 1 is a perspective view of a contact printing system incorporating one embodiment of the present invention.

FIG. 2 is a cross-sectional side view of the contact printing system shown in FIG. 1 along the indicated arrows.

FIG. 3 is a perspective exploded view of an improved transportable vacuum frame workpiece holder in accordance with the present invention.

FIG. 4 is a cross-sectional view of the improved vacuum frame taken along the view of the lead frame arrows as indicated in FIG. 2.

DESCRIPTION OF THE PREFERRED EMBODIMENTS

Figure 5:
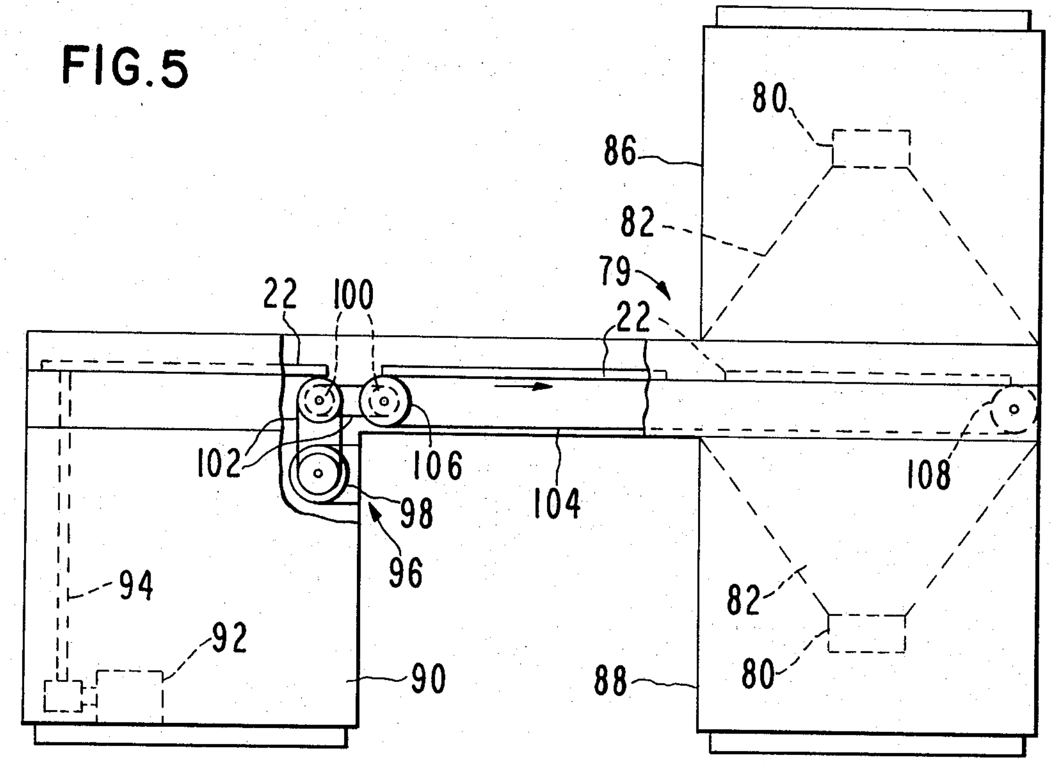
FIG. 5 is a side elevation view, partially in section, of another embodiment of the present invention.

One embodiment of the present invention is shown in FIGS. 1 and 2. A vacuum printing apparatus 10 includes a housing structure 12 which includes evacuation means for providing a vacuum such as a vacuum pump 14. The housing also encloses a radiation source 16 such as a high-pressure, high-energy, short arc, mercury vapor lamp. The radiation source 16 includes a casing 18 enclosing source 16 to which is mounted light reflector 20. Various controls may be mounted on central panel 21 which forms a part of housing 12.

The use of such a mercury vapor lamp as the illumination source 16 provides several advantages. This type of lamp, along with the reflector assembly 20, results in better printing resolution, i.e., ability to print narrower lines and/or spaces.

In operation a workpiece-holding vacuum frame 22 is placed on the top surface 24 of the housing 12. The vacuum frame 22, described in greater detail subsequently, includes at least one transparent surface plate or sheet 26. The workpiece to be exposed, typically coated with a suitable photosensitive emulsion as described previously, is placed within the vacuum frame 22 in a manner which will also be described in greater detail subsequently.

In the position as shown by the solid lines (FIG. 2), vacuum frame 22 is in a position to be evacuated, i.e., to have the air removed from within the vacuum frame to secure the workpiece against transparent sheet 26. Air is removed from the vacuum frame 22 through suitable tubing 28 to the evacuating pump 14. Greater detail of the connected between the tube 28 and the vacuum frame 22 will be given in describing FIG. 4.

Once the frame 22 is evacuated it is then ready for exposure to the radiation provided by lamp 16. The vacuum frame 22 is slid into a receptive or receptacle portion 30 of the housing 12 so as to have the transparent surface 26 disposed in front of the lamp 16. This can be accomplished by moving the frame 22 as indicated by the arrow to the position shown in phantom (FIG. 2) and then by sliding the vacuum frame 22 into the receptacle 30. The vacuum frame 22 is then ready for the exposure.

The length of the exposure time is controlled by the control unit 32 of any suitable, well-known design disposed within the housing 12. A sliding member 34, disposed transversely within the receptive portion 30, is maintained in a normally elevated position relative to the bottom of the housing 12 by suitable biasing means such as a compression spring 36. Switching means 38

(not shown) forms a part of the spring 36. When the vacuum frame is inserted within the receptive portion 30 the member 34 overcomes the spring bias 36. When member 34 reaches the bottom of its descent by forcing down the vacuum frame 22 it locks in position. At this point electrical contact is made within switching means 38. This is sensed by control unit 32 which then initiates the timing cycle. Thus the timing cycle is begun by inserting the frame within the receptive portion 30.

The time cycle can also be activated by providing encoder means 40 along one edge of the vacuum frame 22, as shown in FIGS. 2 and 3. Encoder means includes code information pertaining to the proper exposure time for that particular workpiece. The encoder means 40 could comprise magnets, pins, or magnetic recording materials affixed to the frame 22 by the person who loaded the workpiece within the frame, and either the encoder or its position can be determinative of the cycle time. Encoders such as these are well known to those skilled in the art.

Secured to the housing 12 is a suitable decoder detector 42. Decoder 42 is located so that it will be oppositely disposed from the encoded portion 40 of vacuum frame 22 when the frame 22 is loaded within the receptacle portion 30. The output from the decoder 42 is sent to the control 32 which then works in combination with the previously described switch 38. To initiate the timing cycle of specified duration.

Further, a solenoid-operated release mechanism (not shown) may be operated by control unit 32 on completion of the exposure to release the member 34. When this happens, the compression spring 36 will force the vacuum frame to "pop" up so the operator will known the exposure is complete.

The printing apparatus 10 shown provides the user with great flexibility in processing workpieces. For example, it is possible using a single unit 10 for one vacuum frame to be exposed while another frame is being evacuated. This should be compared with the previously described prior art devices wherein the workpiece holder could not be disconnected from the evacuation means until after the exposure period. There it is necessary for the operator to wait until both the evacuation and the exposure have occurred before beginning to process a new workpiece. Furthermore, the operator must wait until the vacuum is released before another workpiece can be exposed. In comparison, according to the present invention, the release of the vacuum can occur any time after the exposure and it is not necessary for the operator to be on hand during that time and other vacuum frames can be exposed during the interim period.

By automatically being able to control the exposure time, the contact printing apparatus 10 is more readily adaptable with the varying exposure times of the different types of photoresists available. More particularly, by use of the encoder means 40 and decoder 42 the control means 32 is able to sense whether or not a conventional resist in the liquid form is present and if so which one, or whether it is of the laminated film variety, in which case it automatically sets the exposure time accordingly without manual control settings.

Additional flexibility and advantages are also gained by this system. For example, in situations where the exposure times is far less than the time necessary to load each frame, it is possible to have other evacuation stations besides the one within the apparatus 10 illustrated in FIGS. 1 and 2. Thus two operators could be used to evacuate the vacuum frames and alternate placing the vacuum frames within the exposure station. This is not possible in the prior art devices since the exposure and evacuation must occur simultaneously.

FIGS. 3 and 4 illustrate in greater detail the vacuum frame 22. The vacuum frame 22 includes an aluminum upper frame member 44. The lower frame 46 which has a tubular cross section is extruded from any suitable lightweight plastic material. A tubular seal 60 of a material such as a silicone is provided between the upper and lower frames. The workpiece 48 is positioned on the bottom transparent exposure sheet 26.

Plate 50 is made of ultraviolet transmitting plastic such as Roehm & Haas UVT, such plastic is superior to the normally used glass plates which are heavier in weight and which ultraviolet transmission degrades more rapidly with use in an ultraviolet radiation environment. Another advantage of plastic is that small plastic work-alignment pins may be molded onto plastic to facilitate and speed up alignment of the workpieces.

The top exposure plate is formed of a suitable sheet of pliable material 52. In FIG. 4 the sheet 52 is shown in dotted lines which is its position prior to evacuation, and in solid lines after evacuation. It can be seen that after evacuation the sheet 52 conforms to the workpiece 48 as is required in vacuum printing. Where it is only necessary to expose one side of the workpiece 48, the sheet 52 may be made from an opaque material such as vinyl or rubber. Where it is desired to expose both sides of the workpiece 48, transparent material such as Mylar is used.

In order to facilitate alignment of the workpiece and the mask the frame can include alignment pins such as pins 51 molded in the plate 50.

The aluminum upper frame 44 includes a bore 53 located through one edge. A hinge structure 54 is mounted to the lower frame 46. During the loading operation, the upper frame 44 is rotated about the hinge 54.

In one embodiment one end of the upper sheet plate 52 is secured by suitable means at 56. The other end 58 of sheet 52 thus can be lifted up when the upper frame 44 is in the "load" position. Alternately, the sheet 52 may be solely attached to the upper frame 44 so long as enough "play" is provided to allow it to cover the workpiece when evacuated.

After the workpiece is placed on the plastic sheet 26, the Mylar sheet 52 is placed upon the workpiece 48. If the Mylar sheet 52 is secured to the upper frame 44, this is automatically accomplished when the upper frame 44 is lowered into place. As shown, the sheet 52 extends, when in place, from its secured position at 56 around the circumference of the seal 60 across the workpiece over the other portion of the seal 60. The top plate 44 is then rotated about the hinge 54 and is clamped to the lower plate 46 by suitable means (not shown). The force of the upper plate 44 upon the seal 60 is sufficient to maintain the Mylar in position and to maintain a vacuum tight seal. The overall dimensions for a transportable vacuum frame now being manufactured is 23 by 29 by 1.5 inches high, with an exposure area of 20 by 26 inches.

As previously explained, one of the significant advantages of the present invention is the ability of the vacuum frame 22 to be transported as required between the evacuation and the exposure stations. Referring to FIG. 4, this is accomplished by the use of a check valve assembly 62 which extends within the lower frame 46 to the air-tight cavity enclosing the workpiece 48. The valve assembly 62 includes a female receptacle for receiving a male portion 64 attached to the end of tube 28. Male portion 64 is mounted by a suitable bracket means 66 to the housing 12. Thus, when the vacuum frame 22 is placed on the top of the vacuum printing apparatus 10, the male portion 64 fits within the female portion 62 of the valve 62 so that when the pump 14 is energized, air passes out of vacuum frame 22 through the valve.

Because of the action of the check valve 62 when the vacuum frame 22 is taken off the apparatus 10, the vacuum will be retained until relieved at a later time after exposure. Air is permitted to re-enter the vacuum frame 22 by opening a relief valve 68.

To make sure that the vacuum has not be inadvertently released, indicating means 70 is provided. This may simply comprise a bellows arrangement 72 extending through a hole 74 in the frame 46. An indicating pin 76 is secured to the bellows. When the bellows is in the unevacuated state, the pin is in the position indicated in dotted lines. However, when evacuated, the bellows and pin are drawn within the vacuum frame and the pin is no longer seen by visual observation.

Another example of how the flexibility of the transportable vacuum frame may be utilized is shown in another embodiment of the present invention in FIG. 5. This embodiment includes an exposure station 79 comprising two light sources 80 and corresponding light reflectors 82 which are oppositely disposed to one another within respective housing assemblies 86 and 88. When in the position indicated by dotted lines, a vacuum frame having transparent upper and lower surfaces may be exposed simultaneously to both sides.

The evacuation means 92 indicated by dotted lines in this embodiment is located in a separate housing 90. The actual evacuation means 92 includes the tube 94 extending to the top of the housing 90 and in such a position so as to receive the vacuum frame 22 when placed upon the top of the assembly 90 as shown. Details of the vacuum frames and evacuation means are the same as those described with regard to FIGS. 1 through 4. Also mounted within the housing 90 is transport apparatus 96 which includes a motor 98, suitable pulley wheels 100 and pulley belts 102. A conveyor belt 104 rotates about rollers 106 and 108.

After the vacuum frame 22 is evacuated, it is placed on the conveyor belt 104 for transport to the exposure station 79. When the vacuum frame is within the exposure apparatus at the position indicated by the dotted lines, the transport system is stopped, either by manual or automatic means, and the exposure is made in the manner previously described. The transport system is then energized and the vacuum frame 22 is ejected from the exposure station 79 as indicated by the arrow and the next frame is moved within the exposure station 79. Alternately the frame can be dropped down onto the lower portion of the conveyor 104 and withdrawn from the exposure chamber toward the loading station.

Since the frame 22 is exposed from both sides, the conveyor belt can be made of a transparent material or else be provided with cut-out portions to allow passage of the light radiation therethrough.

Figure 6:
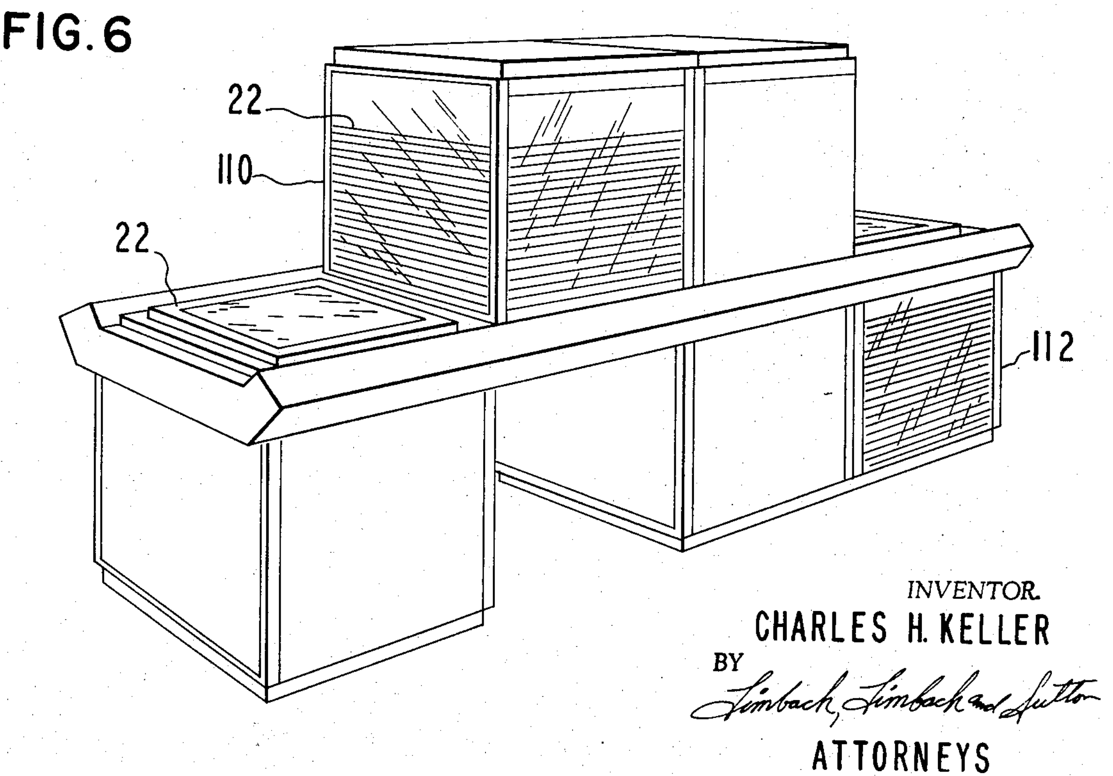
FIG. 6 is a perspective view of still another embodiment of the present invention.

FIG. 6 shows a contact printing system similar to that of FIG. 5, but includes additional features which illustrate the flexibility of the present invention. Besides those portions described in FIG. 5, there are included to magazine assemblies 110 and 112. After the vacuum frame 22 is evacuated, it is stacked within the magazine 110 as shown. The magazine dispenses individual vacuum frames onto the conveyor belt and into the exposure section as fast as each exposure can be made. This maximizes the throughput of the vacuum frames. After exposure, the frames are automatically dispensed from the exposure station 79 into magazine 112 for receiving the exposed frames. Periodically, the frames may be manually or automatically removed from magazine 112.

Note that the frames within magazines 110 and 112 are self-stacking and self-aligning. Furthermore, the vacuum frame described and shown in FIGS. 3 and 4 can be interchangeably used with any of the printing systems described.

It can be seen that the use of the transportable vacuum frames provides tremendous flexibility. Thus, it is possible to go beyond even the embodiment of FIG. 6. For example, several evacuation stations can be provided for feeding the magazine 110. Further, the magazine 112 may dispense vacuum frames onto other conveying means for transportation to other processing centers. For example, in the case of lead frame manufacturing, the frames 22 could be transferred to that portion of the manufacturing plant wherein the etching processing occurs.

Thus the system described can be integrated as described and as required by the particular needs of the individual manufacturer. Unlike prior art devices which are basically manually operated and limited in speed and efficiency, the present invention provides the utmost in flexibility, speed and reliability to the manufacturer.

Although the foregoing invention has been described in some detail by way of illustration and example for purposes of clarity of understanding, it is understood that certain changes and modifications may be practiced within the spirit of the invention as limited only by the scope of the appended claims.

I claim:

1. Transportable workpiece holding apparatus for use with contact printing apparatus, the latter including air evacuation means and photo-exposure means, comprising:

i. a frame;

ii. first and second sheets attachable with said frame, wherein at least one of said sheets is transparent, and wherein said frame and said first and second sheets may be secured to define a substantially air-tight cavity when a workpiece is placed therein;

iii. valve means forming a part of said frame and communicating with said cavity and through which air within said cavity can be evacuated; said valve means additionally maintaining said evacuated condition during transportation of same; and iv. wherein said transportable workpiece holding apparatus is releasibly connectable with said evacuating means during an exposure operation and disconnectable with said evacuating means thereafter to permit said workpiece holding apparatus to be transported remotely and independently from said evacuating and said exposing means.

2. Apparatus as in claim 1 wherein said frame includes a hinged member for providing access to said cavity.

3. Apparatus as in claim 2 wherein said hinged member is formed of aluminum and wherein the substantial remaining portion of said frame is formed from molded plastic.

4. Apparatus as in claim 1 wherein both said first and second sheets are substantially transparent, and where one of said sheets is sufficiently pliable whereby it conforms to said workpiece in said evacuated condition.

5. Apparatus as in claim 1 wherein said at least one of said sheets comprises ultra-violet light transmitting plastic and wherein said other sheet is of a sufficiently pliable material that it conforms to said workpiece in the air evacuated condition.

6. Apparatus as in claim 1 wherein said first sheet comprises an ultra-violet light transmitting plastic and wherein said second sheet comprises Mylar.

7. Apparatus as in claim 6 wherein said first sheet is permanently affixed within said frame and said Mylar is permanently secured to said frame along one side thereof.

8. Apparatus as in claim 1 wherein said workpiece holding apparatus includes means for indicating when it is in an evacuated condition.

9. Apparatus as in claim 8 wherein said indicating means comprises flexible bellows apparatus mounted through said frame to said cavity and an indicating element attached within said bellows apparatus such that when said workpiece holding apparatus is in the evacuated condition the indicating element is drawn substantially within said frame.

10. Apparatus as in claim 1 including means associated with said frame adaptable with externally provided means for controlling the exposure time of an externally provided light source.

11. Contact printing apparatus as in claim 1 wherein said frame comprises an aluminum hinged portion and a second portion formed from molded plastic;

wherein said first sheet comprises an ultra-violet light-transmitting plastic secured to said plastic portion and wherein said second sheet comprises Mylar secured along at least one edge thereof to said plastic frame;

wherein said workpiece holding apparatus includes means for indicating whether it is in an evacuated condition, said means comprising flexible bellows apparatus mounted through said frame to said cavity and an indicating element attached within said bellows apparatus such that when said workpiece holding apparatus is in the evacuated condition the indicating element is drawn substantially within said frame; and means associated with said frame and adaptable with externally provided means for controlling the exposure time of an externally provided light source.

12. Contact printing system using transportable vacuum workpiece holding frames comprising:

a. vacuum workpiece holding frame evacuation stage;

b. light exposure stage comprising oppositely disposed light sources for simultaneous exposure of both sides of said frame;

c. means for transporting said transportable frames between said evacuation stage and said light exposure stage;

d. wherein said evacuation stage is disengagable with said transportable vacuum holding frames after evacuation thereof to permit the same to be transported remotely and independently from said evacuation stage;

e. and wherein said vacuum workpiece holding frames include value means forming a part of said frames to which said evacuation stage is engagable and for maintaining the vacuum during transportation of the frame.

13. System as in claim 12 including first magazine apparatus for receiving a plurality of vacuum frames from said evacuation stage and for sequentially dispensing said frames to said transporting means.

14. A system as in claim 13 including second magazine apparatus, and means for transporting exposed frames from said light exposure stage to said second magazine apparatus.

15. A system as in claim 12 including means for transporting said transportable vacuum holding frames from said light exposure stage to subsequent work processing stages.

16. A system as in claim 12 including means responsive to coded information associated with each of said vacuum frames for controlling the light exposure time for each of the respective vacuum frames.

17. A system as in claim 12 wherein said evacuation stage comprises:

a. means for mounting at least one vacuum frame;

b. means selectively adaptable with each of said vacuum frames for evacuating the same.

18. Contact printing apparatus for exposing a workpiece comprising:

a. a controllable radiation source;

b. means for exposing the workpiece to said controllable radiation source for a predetermined period of time;

c. air evacuation means; and d. a transportable workpiece holding apparatus comprising i. a frame;

ii. first and second sheets sealably attachable to said frame, wherein at least one of said sheets is substantially transparent and wherein said frame and said first and second sheets can be secured to define a substantially air-tight cavity for holding a workpiece; and iii. valve means releasibly connectable with said evacuation means and secured to and forming a part of said frame and communicating with said cavity and through which said cavity can be evacuated, said valve means additionally maintaining said evacuated condition when said workpiece holding apparatus is disconnected from and transported independently and remotely from said evacuation means.

19. Apparatus as in claim 18 including a housing assembly for said controllable radiation source and said evacuation means, and wherein said evacuating means comprises a vacuum pump.

20. Apparatus as in claim 19 wherein said at least one of said sheets comprises ultra-violet light-transmitting plastic and wherein said other sheet comprises pliable Mylar;

wherein said workpiece holding apparatus includes means for indicating whether said workpiece holding apparatus is in an evacuated condition, said indicating means comprising flexible bellows apparatus mounted through said frame to said cavity and an indicating element attached within said bellows such that when said workpiece holding apparatus is in the unevacuated condition said indicating element extends substantially outside of said frame; and including encoded means associated with said transportable workpiece holding apparatus and decoder means associated with said housing assembly operable with said controllable light source to regulate the duration of exposure time in accordance with the requirements of a particular workpiece; and means forming a part of said housing for spring-loading said vacuum frames and wherein said frames will be spring-ejected at least partially from within said housing after exposure to said radiation source.

21. Apparatus as in claim 19 wherein both said first and second sheets are substantially transparent, and where one of said sheets is sufficiently pliable whereby it conforms to said workpiece in said evacuated condition.

22. Apparatus as in claim 21 wherein the inside surface of one of said transparent sheets includes at least one workpiece alignment pin.

23. Apparatus as in claim 18 wherein said at least one of said sheets comprises ultra-violet light transmitting plastic and wherein said other sheet is of a sufficiently pliable material that it conforms to said workpiece in the air-evacuated condition.

24. Apparatus as in claim 18 wherein said workpiece holding apparatus includes means for indicating when it is in an evacuated condition.

25. Apparatus as in claim 24 wherein said indicating means comprises flexible bellows apparatus mounted through said frame to said cavity and an indicating element attached within said bellows such that when said workpiece holding apparatus is in the evacuated condition the indicating element is drawn substantially within said frame.

26. Apparatus as in claim 18 including encoded means associated with said transportable workpiece holding apparatus and decoder means associated with said housing assembly operable with said controllable radiation source to regulate the duration of the exposure time in accordance with the requirements of a particular workpiece.

27. Apparatus as in claim 18 wherein said radiation source comprises a relatively high-pressure, high-energy, mercury vapor lamp.

28. Contact printing apparatus for exposing a workpiece comprising:

a. a controllable radiation source;
b. means for exposing the workpiece to said controllable radiation source for a predetermined period of time;
c. air evacuation means; and
d. a transportable workpiece holding apparatus comprising:
   i. a frame;
   ii. first and second sheets sealably attachable to said frame, wherein at least one of said sheets is substantially transparent and wherein said frame and said first and second sheets can be secured to define a substantially air-tight cavity for holding a workpiece;
   iii. vacuum retaining means connected to and forming a part of said transportable frame for evacuating a substantial portion of the air within said cavity and for maintaining said evacuated condition during light exposure thereof; and
   iv. wherein said transportable workpiece holding apparatus is releasibly connectible with said evacuation means during an exposure operation and disconnectable with said evacuation means thereafter to permit said transportable workpiece holding apparatus to be transmitted remotely and independently from said evacuation means.

29. Apparatus as in claim 28 including a housing assembly for said controllable radiation source and said evacuation means, and wherein said evacuation means comprises a vacuum pump.

30. Apparatus as in claim 28 wherein both said first and second sheets are substantially transparent, and where one of said sheets is sufficiently pliable whereby it conforms to said workpiece in said evacuated condition.

31. Contact printing process comprising the steps of:

a. evacuating transportable workpiece holding vacuum frame assemblies;
b. maintaining said vacuum by providing valve means as a part of said vacuum frame assemblies;
c. disconnecting said transportable vacuum frame assemblies from the evacuating source after the step of evacuating said frames to permit said frames to be remotely and independently transported from said evacuating source; and
d. radiating at least one side of said vacuum frame with light emitted within a light exposure station.

32. Process as in claim 31 including the final additional step of transporting said exposed frames from said light exposure station for further processing.

33. Process as in claim 31 including the additional steps between the steps disconnecting and radiating of stacking said frame assemblies in a magazine dispensing assembly.

34. Process as in claim 31 wherein said step of radiating includes passing said frame through a light exposure station which includes two light source-reflector combinations disposed such that opposite sides of said vacuum frame assemblies can be radiated simultaneously.

35. Process as in claim 31 including the final additional step of transporting a exposed frames from said light exposure station to a magazine loaded receptacle.

* * * * *

UNITED STATES PATENT OFFICE
CERTIFICATE OF CORRECTION

Patent No. 3,694,081 Dated September 26, 1972

Inventor(s) Charles H. Keller

It is certified that error appears in the above-identified patent and that said Letters Patent are hereby corrected as shown below:

On the cover sheet [73] the name of the assignee should read -- Illumination Industries, Inc. --.

Signed and sealed this 1st day of May 1973.

(SEAL)
Attest:

EDWARD M.FLETCHER,JR.
Attesting Officer

ROBERT GOTTSCHALK
Commissioner of Patents